(12) United States Patent
Huwer

(10) Patent No.: US 8,164,335 B2
(45) Date of Patent: Apr. 24, 2012

(54) METHOD FOR ACQUIRING AND DISPLAYING MEDICAL IMAGE DATA

(75) Inventor: Stefan Huwer, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 344 days.

(21) Appl. No.: 12/591,206

(22) Filed: Nov. 12, 2009

(65) Prior Publication Data

US 2010/0134106 A1 Jun. 3, 2010

(51) Int. Cl.
*G01V 3/00* (2006.01)

(52) U.S. Cl. ........................................ 324/309; 324/307

(58) Field of Classification Search .......... 324/300–322; 600/407–445; 382/103, 128, 199, 274, 283
See application file for complete search history.

(56) References Cited

U.S. PATENT DOCUMENTS

| 2006/0103670 | A1* | 5/2006 | Matsumoto | 345/626 |
|---|---|---|---|---|
| 2006/0233454 | A1* | 10/2006 | Cheng et al. | 382/274 |
| 2008/0085040 | A1* | 4/2008 | Basu et al. | 382/128 |
| 2009/0226033 | A1* | 9/2009 | Sefcik | 382/103 |
| 2011/0012778 | A1* | 1/2011 | Nguyen et al. | 342/25 A |
| 2011/0044524 | A1* | 2/2011 | Wang et al. | 382/131 |

OTHER PUBLICATIONS

M.S. Atkins et al., "Automatic Segmentation of the Brain in MRIi", Visualization in Biomedical Computing, 1996, vol. 113, S. 241-246; Others; 1996.

* cited by examiner

*Primary Examiner* — Brij Shrivastav
(74) *Attorney, Agent, or Firm* — Harness, Dickey & Pierce, P.L.C.

(57) ABSTRACT

A method is disclosed for acquiring and displaying image data, in particular MR image data. In at least one embodiment, the method includes scanning an examination object by way of a magnetic resonance imaging scanner and generating first (MR) image data of the examination object, wherein scanning parameters during the scan are selected such that the regions of interest in the scanned examination object have high image data values, and the regions which are not of interest in the examination object have, relative thereto, low image data values in the first MR image data; generating a mask on the basis of the first image data by means of which mask regions in the first MR image data which have the low image data values can be hidden; scanning the examination object by way of a medical imaging system and generating second image data of the examination object; applying the mask to the first and/or second image data; and displaying the first and/or second image data processed by the mask.

16 Claims, 1 Drawing Sheet

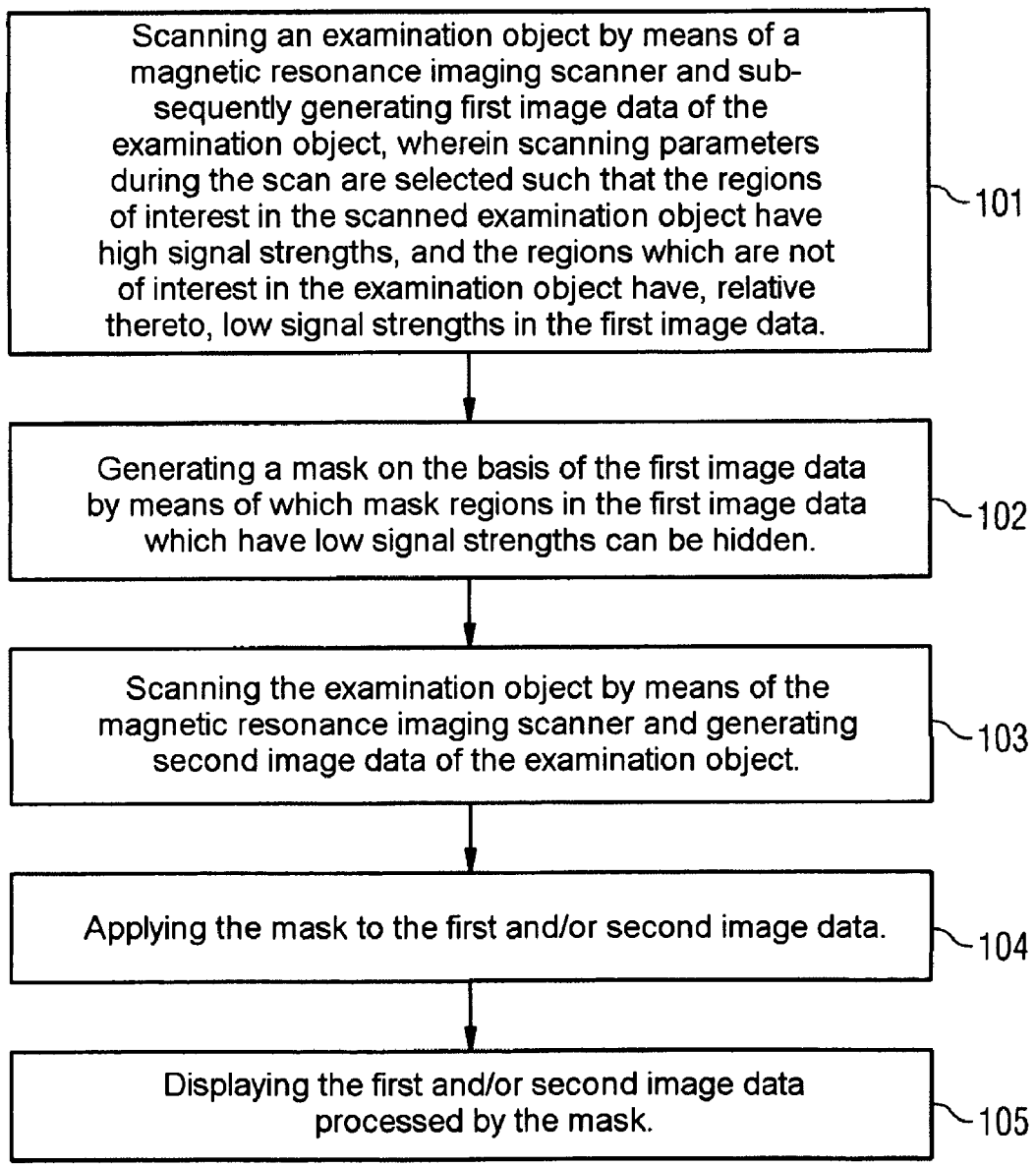

METHOD FOR ACQUIRING AND DISPLAYING MEDICAL IMAGE DATA

PRIORITY STATEMENT

The present application hereby claims priority under 35 U.S.C. §119 on German patent application number DE 10 2008 057 083.4 filed Nov. 13, 2008, the entire contents of which are hereby incorporated herein by reference.

FIELD

At least one embodiment of the present invention lies in the field of medical technology and describes a method for acquiring and displaying medical image data, in particular magnetic resonance (MR) image data.

BACKGROUND

It is well known that magnetic resonance imaging (MRI) can be used to display the density of nuclear spins, in particular of $^1$H, $^{31}$P and $^{23}$Na atoms, in the volume of an examination object as a function of the position. In the process, different tissue types are reproduced in the MR image with varying signal strength mainly based on the different spin-relaxation times in the tissues. The signal strengths acquired by the magnetic resonance imaging scanner during the scan which are associated with the respective voxels of the examination object depend on a number of parameters and are typically imaged as corresponding grayscale values in the image data. Hence, magnetic resonance imaging does not have standard values for the scan signal of certain tissue types nor a unit which can be compared to the Hounsfield Unit of computed tomography. Rather, the MR image data specifies fundamentally arbitrary units which cannot be directly evaluated diagnostically. Typically, the image is interpreted on the basis of the overall contrast, the respective weighting (e.g. T1, T2, T2* or PD weighting) on which the image data is based and the signal differences between different tissues.

Visualizing MR image data (2D or 3D MR image data) often requires the removal of anatomical structures imaged in the MR image data in order to end up with an unimpeded view of the anatomical objects of interest. Thus, in the case of examinations, treatments or interventions in the brain of a patient, the medical practitioner is interested in an exclusive representation or display of the brain which includes its structures, but is without bothersome cranial bones or other anatomical structures impeding the direct view of the brain.

These days, so-called direct volume rendering (DVR) for the 3D display of MR image data is routinely used in clinical practice. In the process, transfer functions image the measured value of the original data to colors and opacities in order to generate images which are as meaningful as possible. However, when there are spatially separate regions of an MR image data record with the same intensity value, transfer functions cannot offer a different display, and the structures toward the back are covered. An example of this are the previously mentioned MR image data records of the head, where as a result of equal measured values the brain is always covered by more outwardly lying tissue. Before corresponding MR image data is visualized/displayed/illustrated in such applications, the bothersome elements, e.g. cranial bones or objects not part of the anatomical structure of the brain, imaged in the MR image data are removed. In the prior art, methods for removing the cranial bones imaged in the MR image data are known as so-called skull stripping methods.

Since T1, T2, T2* or PD weighted MR image data in each case has different signal intensities for bone material and the brain, this has to be taken into account in the skull stripping methods. A further problem of known skull stripping methods lies in the fact that the MR image data often has anisotropic characteristics, i.e. image data values of one and the same imaged material for example can differ in various regions of an MR image. Moreover, the voxel geometries can vary in the MR image data. These are significant, but not the only, problems which have to be solved, at least to a great extent, by the best skull stripping methods of the prior art. Skull stripping methods therefore require complex image processing processes, and require high computational complexity and a correspondingly long calculation time.

These days, skull stripping methods are used within the scope of MR image data post-processing. They largely satisfy high requirements in respect of quality and accuracy. These methods are for example used to examine changes in the brain mass or brain volume or parts thereof. Here, the skull stripping method is part of a complex image data evaluation process which as a result supplies the desired numerical details regarding deviations of the brain mass or the brain volume. The algorithms used in this case are distinguished by great complexity. However, they are usually limited in their applicability to MR image data generated with certain recording parameters. Thus the algorithms cannot be used universally. In addition, the known skull stripping methods in part require that the brain is completely imaged in the MR image data and that the MR image data is distinguished by almost isotropic properties.

The skull stripping methods known in the prior art can mainly be subdivided into the following three categories: region-based methods, model-based methods and hybrid methods which comprise a combination of the abovementioned methods.

All known skull stripping methods use that MR image data as input data which should later be displayed, for example, without cranial bones or other bothersome elements. A mask is generated on the basis of this MR image data by means of a segmentation method, by means of which mask, for example, the cranial bones imaged in this MR image data can be hidden very accurately. Furthermore, these methods are so optimized and specific that they can in each case only be applied to MR image data recorded using specific parameters.

The known skull stripping methods typically require a few tens of seconds of calculation time before the MR image data processed by the skull stripping method can be displayed. These relatively long calculation times are often unacceptable in clinical operation. The treating medical practitioner often needs to have a quick overview over the cortex surface imaged in the MR image data. This includes, in particular, fast overview displays of image displays also composed of a number of MR image data (e.g. within the scope of functional magnetic resonance imaging (fMRI)).

SUMMARY

In at least one embodiment of the present invention includes specifying a method for acquiring and displaying image data in which predeterminable pixels can be hidden prior to being displayed, without changing the quality of the displayed image data. The method should be suitable, in at least one embodiment, for displaying MR image data and a brain imaged therein without cranial bones (skull stripping) and should minimize the calculation times typical for skull stripping methods known in the prior art. Furthermore, the above-mentioned further disadvantages of known skull stripping methods should be reduced.

The method according to at least one embodiment of the invention for acquiring and displaying image data comprises at least the following method steps:

1.1. scanning an examination object by way of a magnetic resonance imaging scanner and subsequently generating first image data of the examination object, wherein scanning parameters during the scan are selected such that the regions of interest in the scanned examination object have high image data values, and the regions which are not of interest in the examination object have, relative thereto, low image data values in the first image data, 1.2. generating a mask on the basis of the first image data by way of which mask regions in the first image data which have the low signal strengths can be hidden, 1.3. scanning the examination object by way of a medical imaging system and generating second image data of the examination object, 1.4. applying the mask to the first and/or second image data and 1.5. displaying the first and/or second image data processed by the mask.

At least one embodiment of the invention is based on the idea of generating a mask from first (MR) image data of an examination object, wherein, for this purpose, scanning parameters during the corresponding scan of the examination object are selected such that the regions of interest in the scanned examination object have high signal strengths (image data values), and the regions which are not of interest in the examination object have, relative thereto, low signal strengths (image data values) in the first (MR) image data. The mask can thus be generated by simple and robust threshold operation which saves computational time.

When applied to the first and/or second image data, the mask hides all image data which has the relatively low signal strengths, i.e. signal strengths lying below the selected threshold. The mask generated in this fashion thus fixes a two or three dimensional filter volume that can be hidden or deleted such that in step 1.5 only that 2D or 3D image data of interest which is not hidden by the mask is displayed.

By way of example, in addition to further parameter settings, the parameter settings conventional for recording image data within the scope of functional magnetic resonance imaging (so-called "BOLD-fMRI" time series; BOLD=blood oxygen level dependence) are suitable for generating the first image data. Furthermore, recording parameters which are used for recording image data within the scope of so-called trace weighted diffusion scans are also suitable. In both cases, the brain for example is reproduced with high signal strengths, whereas bone material is only acquired with very low signal strengths in the image data.

The scanning parameters in step 1.1 are preferably selected such that, in the first image data, the signal strengths of the regions which are not of interest in the examination object are of the order of the signal noise of the image data values assigned to the first image data. It follows that a threshold should be used to generate the mask which correspondingly hides all image data whose image data values are of the order of the signal noise.

The mask is preferably generated automatically by applying a predeterminable and/or interactively changeable threshold to the first MR image data.

After generating the mask in steps 1.1 and 1.2, the examination object is scanned a further one or more times. This is preferably effected using the magnetic resonance imaging scanner from step 1.1. In these further scans (step 1.3) the operator can freely choose the scanning parameters. Thus, MR image data with the most diverse scanning parameters or weightings (e.g. T1, T2, T2*, PD, . . . ) can be generated in step 1.3. Of course, a different medical imaging system, e.g. a CT or MRI/PET system, can also be used as a medical imaging system in step 1.3 rather than an MRI scanner. In this case, the mask data record necessarily has to be registered to the second image data record before applying the mask to the second image data.

A significant advantage of the method according to at least one embodiment of the invention lies in the fact that the hiding of image regions which are not of interest or which are even bothersome in the display effected by the mask is as far as possible independent of the recording parameters or image weighting of the second image data.

The second image data preferably corresponds to a time series of image data generated by multiple sequential scanning of the examination object, and the mask is in each case applied to the image data generated in the process. Naturally, the mask can also be applied to second image data composed of a number of individual records or to second image data superposed by third image data.

As long as steps are taken in each case to ensure that the examination object has not moved since the first (MR) image data was acquired, the mask can be directly applied to the respectively generated second image data in step 1.4 in order to hide pixels which are not of interest or bothersome and for example in order to display the regions of interest directly thereafter in step 1.5. However, if the examination object has moved in the meantime, or this is at least possible, the mask is preferably registered to the second image data before applying the mask to the second image data in step 1.4. This ensures that the mask in each case only hides the regions which are not of interest in the second and first image data.

At least two different scenarios are feasible in respect of the chronological succession of the method steps. On the one hand, first image data with the corresponding recording parameters can first of all be generated in order to afford the possibility of determining the mask (steps 1.1 and 1.2). Subsequently, there are further scans of the examination object and the second image data is in each case generated from the scanning data obtained in the process. The mask is in each case applied to this second image data and finally the second image data filtered by the mask is in each case displayed in step 1.5. On the other hand, the scan to generate the mask in steps 1.1 and 1.2 can also follow step 1.3, but be effected before steps 1.4 and 1.5.

The first image data determined to generate the mask can also be part of a time series of further second (MR) image data obtained by temporally subsequent scans of the examination object.

In a particularly preferred embodiment of the method, the examination object corresponds to the head of a patient and the regions which are not of interest in the examination object in the first and second image data correspond to the cranial bones. This variant of the method corresponds to a skull stripping method.

The method according to at least one embodiment of the invention permits a simple, robust and in particular computational-time saving display of image data, in particular MR image data, in which image regions which are not of interest, such as bones or other anatomical elements, and which cover other anatomical regions of interest can be eliminated or hidden prior to being displayed. A further advantage of the method according to the invention consists of the fact that different voxel geometries in the first and second image data, or in the mask obtained from the first (MR) image data, have no significant influence on the method. Thus, the method also supplies good results in the case of, for example, anisotropic voxel geometries.

BRIEF DESCRIPTION OF THE DRAWINGS

FIG. 1 shows a schematic procedure of the method according to an embodiment of the invention.

DETAILED DESCRIPTION OF THE EXAMPLE EMBODIMENTS

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention FIG. 1 shows a schematic procedure of the method according to an embodiment of the invention. In this example embodiment, the method is intended to be used for displaying the surface structures of the brain of a patient on a monitor, without the view of the brain being impeded by cranial bones.

To this end, step 101 includes scanning the head of the patient by way of a magnetic resonance imaging scanner and subsequently generating first MR image data of the head, wherein scanning parameters during the scan are selected such that the regions of interest in the scanned examination object have high signal strengths, and the regions which are not of interest in the examination object have, relative thereto, low signal strengths in the first MR image data. To this end, recording parameters are selected here which correspond to so-called diffusion weighted magnetic resonance imaging.

In step 102, a mask is generated on the basis of the first MR image data by means of which mask regions in the first MR image data which have the low signal strengths can be hidden. The three-dimensional mask is generated by applying a correspondingly selected threshold to the first MR image data.

Step 103 includes further scanning of the head by way of the magnetic resonance imaging scanner and generating second MR image data of the examination object.

The mask is applied to the second MR image data in step 104. Here, all MR image data which is not of interest is hidden.

Finally, in step 105, the second MR image data processed by the mask is displayed on a monitor.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, computer readable medium and computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a computer readable medium and is adapted to perform any one of the aforementioned methods when run on a computer device (a device including a processor). Thus, the storage medium or computer readable medium, is adapted to store information and is adapted to interact with a data processing facility or computer device to execute the program of any of the above mentioned embodiments and/or to perform the method of any of the above mentioned embodiments.

The computer readable medium or storage medium may be a built-in medium installed inside a computer device main body or a removable medium arranged so that it can be separated from the computer device main body. Examples of the built-in medium include, but are not limited to, rewriteable non-volatile memories, such as ROMs and flash memories, and hard disks. Examples of the removable medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for acquiring and displaying medical image data, comprising:
    scanning an examination object by way of a magnetic resonance imaging scanner and subsequently generating first image data of the examination object, wherein scanning parameters during the scan are selected such that regions of interest in the scanned examination object have high image data values, and the regions which are not of interest in the examination object have, relative thereto, low image data values in the first image data;
    generating a mask on the basis of the first image data by way of which mask regions in the first image data which have the low image data values can be hidden;
    scanning the examination object by way of a medical imaging system and generating second image data of the examination object;
    applying the mask to at least one of the first and second image data; and
    displaying the at least one of first and second image data to which the mask is applied.

2. The method as claimed in claim 1, wherein the scanning parameters are selected such that the image data values of the regions which are not of interest in the examination object are of the order of the image data noise of the first image data.

3. The method as claimed in claim 1, wherein at least one of the first and second image data is 2D or 3D image data.

4. The method as claimed in claim 1, wherein the examination object is the head of a patient and the regions which are not of interest in the first image data correspond to the cranial bones.

5. The method as claimed in claim 1, wherein the medical imaging system is a magnetic resonance imaging scanner, the magnetic resonance imaging scanner performing each of the scanning steps.

6. The method as claimed in claim 5, wherein the second image data has an arbitrary weighting.

7. The method as claimed in claim 1, wherein the mask is generated automatically by applying at least one of a predeterminable and interactively changeable threshold to the first image data.

8. The method as claimed in claim 1, wherein the mask is registered to the second image data before applying said mask to the second image data.

9. The method as claimed in claim 5, wherein the first and second image data are recorded within the scope of functional magnetic resonance imaging.

10. The method as claimed in claim 1, wherein the first image data is recorded within the scope of diffusion weighted magnetic resonance imaging.

11. The method as claimed in claim 1, wherein the second image data corresponds to a time series of image data generated by multiple sequential scanning of the examination object, and the mask is respectively applied to the image data generated in the process.

12. The method as claimed in claim 1, wherein, chronologically, the scanning of the examination object by way of a magnetic resonance imaging scanner and the generating of the mask are performed prior to the scanning of the examination object by way of the medical imaging system.

13. The method as claimed in claim 1, wherein, chronologically, the scanning of the examination object by way of a magnetic resonance imaging scanner and the generating of the mask are performed after the scanning of the examination object by way of the medical imaging system.

14. The method as claimed in claim 2, wherein at least one of the first and second image data is 2D or 3D image data.

15. The method as claimed in claim 2, wherein the examination object is the head of a patient and the regions which, are not of interest in the first image data correspond to the cranial bones.

16. The method as claimed in claim 6, wherein the weighting is a T1, T2, T2* or PD weighting.

* * * * *

UNITED STATES PATENT AND TRADEMARK OFFICE
CERTIFICATE OF CORRECTION

PATENT NO. : 8,164,335 B2
APPLICATION NO. : 12/591206
DATED : April 24, 2012
INVENTOR(S) : Stefan Huwer It is certified that error appears in the above-identified patent and that said Letters Patent is hereby corrected as shown below:

Title page, item (30) Foreign Application Priority Data should read as follows:

Nov. 13, 2008 (DE) ........................10 2008 057 083

Signed and Sealed this
Thirtieth Day of April, 2013

Teresa Stanek Rea
*Acting Director of the United States Patent and Trademark Office*